(12) United States Patent
Chuang et al.

(10) Patent No.: US 8,659,123 B2
(45) Date of Patent: Feb. 25, 2014

(54) METAL PAD STRUCTURES IN DIES

(75) Inventors: Yao-Chun Chuang, Taipei (TW); Chita Chuang, Kaohsiung (TW); Chen-Cheng Kuo, Chu-Pei (TW); Chen-Shien Chen, Zhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 6 days.

(21) Appl. No.: 13/247,616

(22) Filed: Sep. 28, 2011

(65) Prior Publication Data

US 2013/0075872 A1 Mar. 28, 2013

(51) Int. Cl.
*H01L 23/58* (2006.01)

(52) U.S. Cl.
USPC .... 257/632; 257/738; 257/737; 257/E23.021; 257/E23.069; 257/E21.508

(58) Field of Classification Search
USPC ................. 257/210, 211, 503, 508, 257/E33.062–E33.066, E31.124–E31.126, 257/E21.109, 737, 738, E23.021, E23.069, 257/E21.508, 632, 23.021; 438/149, 165, 438/166
See application file for complete search history.

(56) References Cited

U.S. PATENT DOCUMENTS

| 7,776,627 | B2 * | 8/2010 | Jeng et al. | 438/18 |
| 2011/0241202 | A1 | 10/2011 | Liu et al. | |
| 2011/0298574 | A1 * | 12/2011 | Sato et al. | 336/84 C |
| 2012/0049343 | A1 * | 3/2012 | Schulze et al. | 257/737 |
| 2012/0074534 | A1 * | 3/2012 | Lin et al. | 257/632 |
| 2012/0133032 | A1 * | 5/2012 | Tsai et al. | 257/659 |

FOREIGN PATENT DOCUMENTS

JP 02006005163 A * 1/2006

* cited by examiner

*Primary Examiner* — Marc Armand
(74) *Attorney, Agent, or Firm* — Slater & Matsil, L.L.P.

(57) ABSTRACT

A die includes a substrate, a metal pad over the substrate, and a passivation layer that has a portion over the metal pad. A dummy pattern is disposed adjacent to the metal pad. The dummy pattern is level with, and is formed of a same material as, the metal pad. The dummy pattern forms at least a partial ring surrounding at least a third of the metal pad.

20 Claims, 8 Drawing Sheets

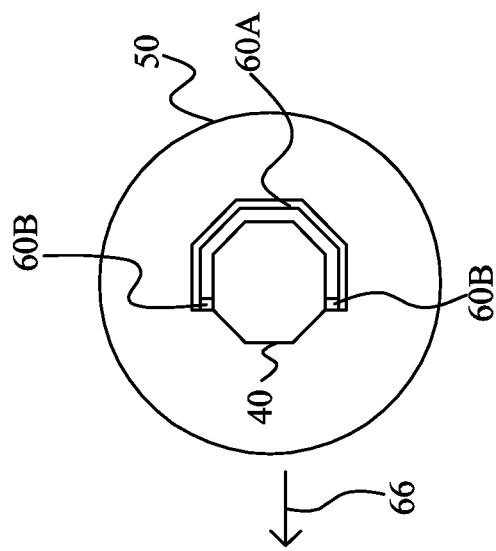
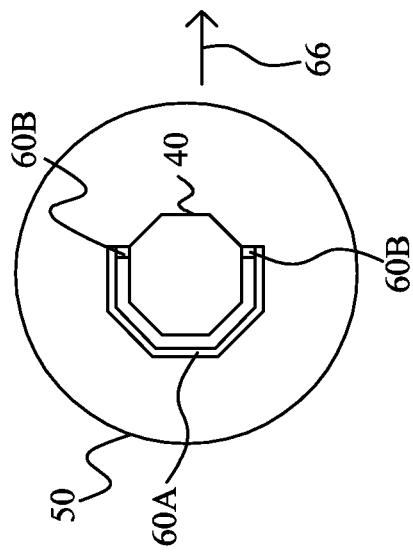
Fig. 4A
Fig. 4B

METAL PAD STRUCTURES IN DIES

BACKGROUND

Integrated circuits are made up of literally millions of active devices such as transistors and capacitors. These devices are initially isolated from each other, and are later interconnected to form functional circuits. Typical interconnect structures include lateral interconnections, such as metal lines (wirings), and vertical interconnections, such as vias and contacts. Interconnect structures are increasingly determining the limits of performance and the density of modern integrated circuits.

On top of the interconnect structures, connector structures are formed, wherein bond pads or metal bumps are formed and exposed on the surface of the respective chip. Electrical connections are made through the bond pads/metal bumps to connect the chip to a package substrate or another die. The electrical connections may be made through wire bonding or flip-chip bonding.

One type of the connector structures includes an aluminum pad electrically connected to the interconnect structures formed of copper. A passivation layer and a polymer layer are formed, with portions of the passivation layer and the polymer layer covering edge portions of the aluminum pad. An under-bump metallurgy (UBM) is formed to extend into the opening in the passivation layer and the polymer layer. A copper pillar and a solder cap may be formed on the UBM and reflowed.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative, and do not limit the scope of the disclosure.

Connector structures in semiconductor dies are presented in accordance with an embodiment. The variations of the embodiment are then discussed. Throughout the various views and illustrative embodiments, like reference numbers are used to designate like elements.

Figure 1:
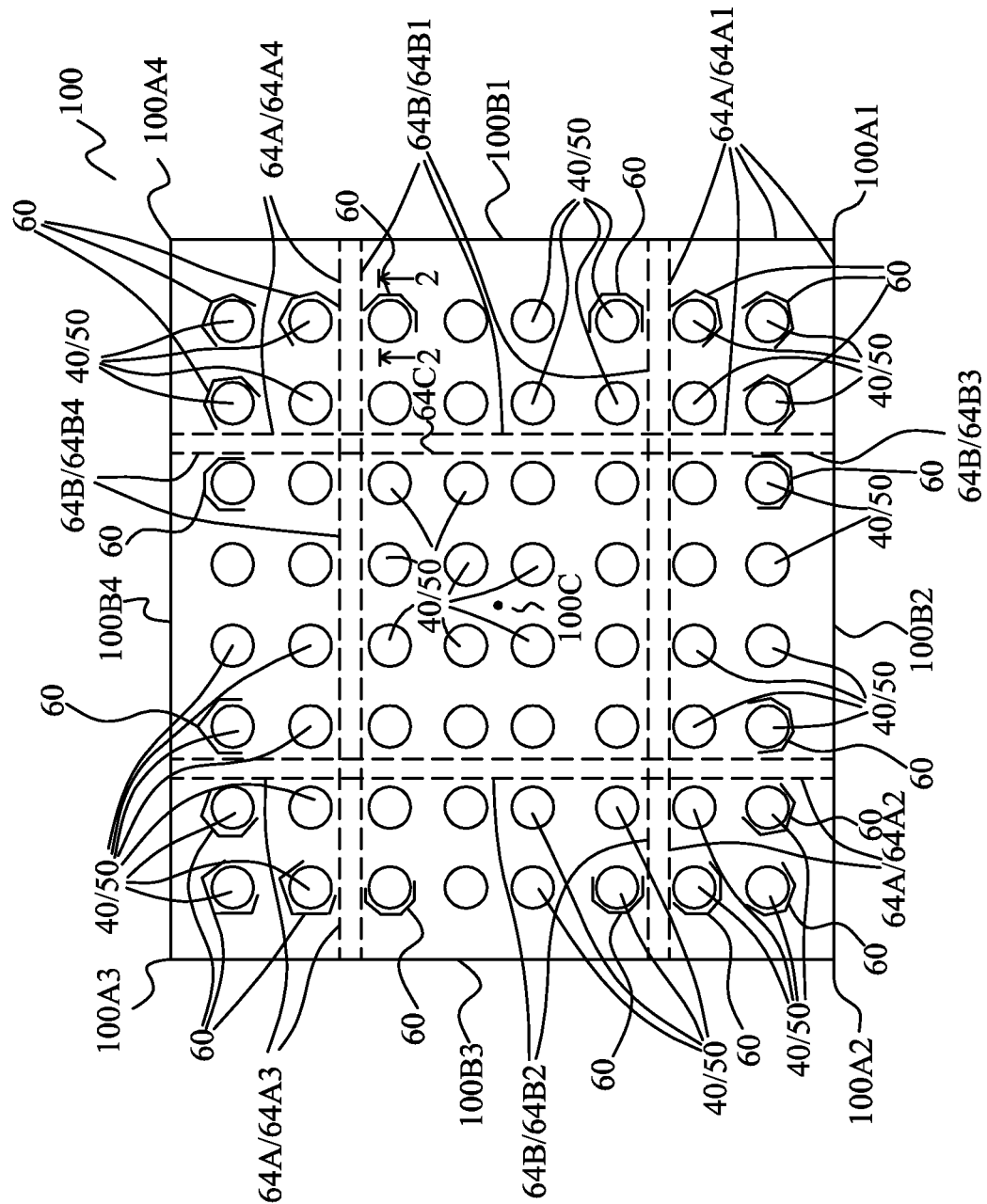
FIG. 1 illustrates a top view of a die, wherein connector structures are distributed in corner regions, edge regions, and an inner region of the die.

FIG. 1 illustrates a top view of die 100 in accordance with various embodiments. Die 100 may be a device die. Die 100 has corners 100A (including corners 100A1 through 100A4) and edges 100B (including edges 100B1 through 100B4). Die 100 includes a plurality of surface regions including corner regions 64A (including 64A1 through 64A4), edge regions 64B (including 64B1 through 64B4), and inner region 64C encircled by corner regions 64A and edge regions 64B. A plurality of electrical connectors 50 may be formed at the surface of die 100. Electrical connectors 50 may be connected to the underlying metal pads 40.

Figure 2:
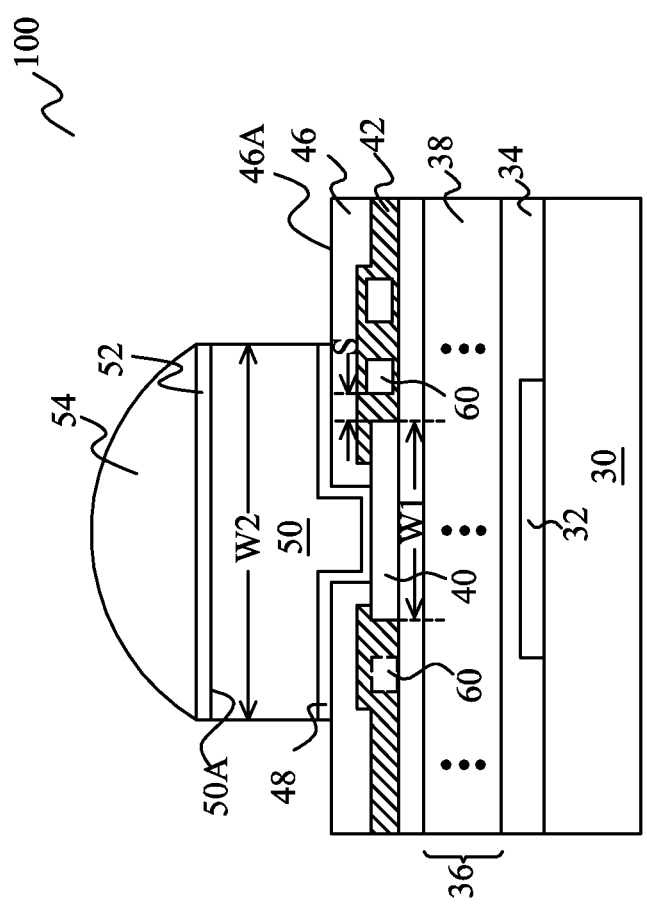
FIG. 2 illustrates a cross-sectional view of a portion of the die shown in FIG. 1.

The details of exemplary electrical connectors 50 and metal pads 40 are shown in FIG. 2, which shows a cross-sectional view of a portion of die 100, wherein the cross-sectional view is obtained from the plane crossing line 2-2 in FIG. 1. Die 100 includes semiconductor substrate 30. In an embodiment, die 100 is a device die, which may include integrated circuits 32 having active devices such as transistors (not shown) therein. Semiconductor substrate 30 may be a bulk silicon substrate or a silicon-on-insulator substrate. Other semiconductor materials including group III, group IV, and group V elements may also be used. In alternative embodiments, die 100 may be the die of other package components that do not include active devices therein, and may be an interposer die, for example. In the embodiments wherein die 100 does not include active devices, die 100 may include passive devices such as resistors and capacitors, or free from passive devices.

Die 100 may further include inter-layer dielectric (ILD) 34 over semiconductor substrate 30, and metal layers 36 over ILD 34. Metal layers 36 may include metal lines and vias (not shown) formed in dielectric layers 38. In an embodiment, dielectric layers 38 are formed of low-k dielectric materials. The dielectric constants (k values) of the low-k dielectric materials may be less than about 2.8, or less than about 2.5, for example. The metal lines and vias may be formed of copper or copper alloys, although they can also be formed of other metals.

Metal pad 40 is formed over metal layers 36, and may by electrically coupled to circuits 32 through the metal lines and vias in metal layers 36. Metal pad 40 may be an aluminum pad or an aluminum-copper pad, and hence is alternatively referred to as aluminum pad 40 hereinafter, although other metallic materials may be used to form metal pad 40. Passivation layer 42 is formed to cover the edge portions of aluminum pad 40. The central portion of aluminum pad 40 is exposed through the opening in passivation layer 42. Passivation layer 42 may be a single layer or a composite layer, and may be formed of a non-porous material. In an embodiment, passivation layer 42 is a composite layer comprising a silicon oxide layer (not shown), and a silicon nitride layer (not shown) over the silicon oxide layer. Passivation layer 42 may also be formed of un-doped silicate glass (USG), silicon oxynitride, and/or the like. Although one passivation layer 42 is shown, there may be more than one passivation layer.

Polymer layer 46 is formed over passivation layer 42. Polymer layer 46 may comprise a polymer such as an epoxy, polyimide, benzocyclobutene (BCB), polybenzoxazole (PBO), and the like. Polymer layer 46 is patterned to form an opening, through which aluminum pad 40 is exposed. The patterning of polymer layer 46 may be performed using photo lithography techniques.

Under-bump metallurgy (UBM) 48 is formed over metal pad 40. UBM 48 comprises a first portion over polymer layer 46, and a second portion extending into the opening in polymer layer 46. In an embodiment, UBM 48 includes a titanium layer and a seed layer, which may be formed of copper or copper alloys. Metal pillar 50 is formed on UBM 48, and is co-terminus with UBM 48. The edges of UBM 48 are aligned to respective edges of metal pillar 50. UBM 48 may be in physical contact with metal pad 40 and metal pillar 50. In an exemplary embodiment, metal pillar 50 is formed of a non-reflowable metal(s) that does not melt in reflow processes. For example, metal pillar 50 may be formed of copper or a copper alloy. The top surface 50A of metal pillar 50 is higher than top surface 46A of polymer layer 46. In addition to metal pillar 50, there may be additional metal layers such as metal layer 52 formed on metal pillar 50, wherein metal layer 52 may include a nickel layer, a palladium layer, a gold layer, or multi-layers thereof. Solder cap 54 may also be formed on metal layer 52, wherein solder cap 54 may be formed of a Sn—Ag alloy, a Sn—Cu alloy, a Sn—Ag—Cu alloy, or the like, and may be lead-free or lead-containing. UBM 48 may also be considered as the bottom part of the metal pillar 50.

In an embodiment, lateral dimension W1 of metal pad 40 is smaller than lateral dimension W2 of metal pillar 50. In alternative embodiments, lateral dimension W1 of metal pad 40 is equal to or greater than lateral dimension W2 of metal pillar 50.

Dummy pattern 60 may be formed adjacent to metal pad 40. It is appreciated that die 100 may include a plurality of metal pads 40, and dummy pattern 60 is formed adjacent to some of metal pad 40 in die 100, while other metal pads 40 in die 100 do not have adjacent dummy patterns. Throughout the description, the term "adjacent" is used to describe the geographic relation between metal pads and dummy patterns, and if a dummy pattern is between two neighboring metal pads, and is closer to the first metal pad than to the second, it is considered that the dummy pattern is "adjacent" to the first metal pad, and is not "adjacent" to the second metal pad. Distance S between dummy pattern 60 and the respective adjacent metal pad 40 may be smaller than about 15 µm, and may be between about 1 µm and about 15 µm. Width W1 of dummy pattern 60 may be between about 2 µm and about 20 µm. In an embodiment, dummy pattern 60 is formed on one side of metal pad 40, and is not formed on the other side. In alternative embodiments, dummy pattern 60 extends to opposite sides of metal pad 40, and may form a ring encircling metal pad 40. Dummy pattern 60 and metal pad 40 may be formed in a same process, and hence may be formed of a same material, and have a same thickness.

Referring back to FIG. 1, metal pads 40 and the respective dummy patterns 60 are distributed to a plurality of surface regions in die 100. The surface regions that include dummy patterns 60 may be the regions that subject to high stresses. For example, dummy patterns 60 may be distributed to corner regions 64A (including 64A1 through 64A4) of die 100 and/or edge regions 64B (including 64B1 through 64B4) of die 100. In inner region 64C of die 100, there may exist metal pads 40. No dummy patterns 60, however, are disposed in inner region 64C. Depending on the level of the stress occurring to metal pads 40 and passivation layer 42 (FIG. 2), adjacent to each of corners 100A, there may be one, two, three, four, or more corner rows (counting from corners 100A1-100A4 toward center 100C of die 100) of metal pads 40 having adjacent dummy patterns 60. Also, adjacent to each of edges 100B, there may be one, two, three, four, or more edge rows (counting from edges 100B1-100B4 toward center 100C of die 100) of metal pads 40 having adjacent dummy patterns 60. In some exemplary embodiments, there is one corner metal pad 40 (which is the metal pad closest to the respective corner 100A) having an adjacent dummy pattern 60 at each of corners 100A, while no other corner metal pads, edge metal pads, or inner metal pads have adjacent dummy patterns. Alternatively, in additional to corner metal pads 40, some of the edge metal pads 40 in the very first edge row adjacent to each edge may also have adjacent dummy pattern 60. Other metal pads, however, do not have adjacent dummy pattern 60.

Figure 3A:
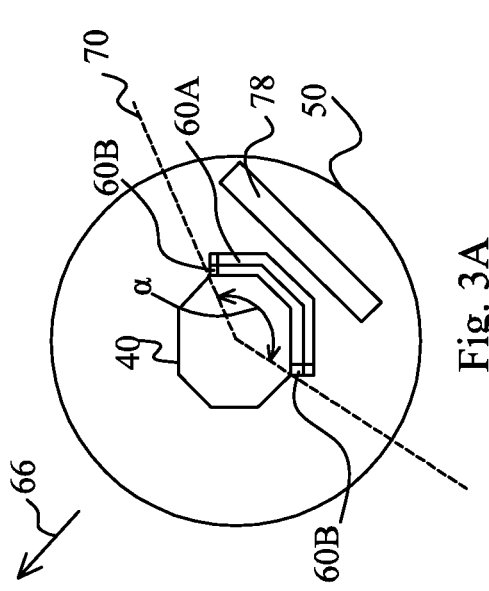
FIGS. 3A through 6 are top views of metal pads, metal pillars, and the respective dummy patterns in accordance with various embodiments.

FIGS. 3A through 4D illustrate the top views of metal pillars 50, metal pads 40, and dummy patterns 60 in accordance with some exemplary embodiments. In each of FIGS. 3A through 4D, arrow 66 is drawn to illustrate the direction of die center 100C (FIG. 1), while the directions opposite to the directions of arrows 66 in FIGS. 3A through 3D are toward corners 100A of die 100 (FIG. 1). The directions opposite to the directions of arrows 66 in FIGS. 4A through 4D are toward edges 100B of die 100 (FIG. 1). As shown in FIGS. 3A through 4D, dummy patterns 60 are formed on one side of the respective metal pad 40, which side is away from center 100C, and is on the side close to the respective edges 100B and/or corners 100A. In each of FIGS. 3A through 4D, dummy patterns 60 partially surround the respective metal pads 40. For example, as shown in FIG. 3A, if lines 70 are drawn extending from the center of metal pad 40 to the ends of dummy patterns 60, lines 70 form angle α. Angle α is also used to measure how much percent of metal pad 40 is surrounded by dummy pattern 60. For example, if angle α is 120 degrees, it is considered that dummy pattern 60 surrounds 120/360, or one third, of metal pad 40. When angle α is equal to 360 degrees, dummy pattern 60 forms a full ring encircling metal pad 40. When angle α is smaller than 360 degrees, dummy pattern 60 forms a partial ring partially surrounding metal pad 40. In some embodiments, angle α is greater than about 90 degrees, greater than about 120 degrees, and may be between about 120 degrees and about 360 degrees.

Each of dummy patterns 60 in FIGS. 3A through 4D includes dummy pattern portions 60A, which is spaced apart from the respective metal pads 40. Different parts of dummy patterns 60A may have a substantially equal distance S from the respective closest parts of metal pad 40. The space between dummy pattern portions 60A and metal pad 40 may be filled with passivation layer 42, at least partially, as shown in FIG. 2. In some embodiments, dummy patterns 60 further include dummy pattern portion(s) 60B, which electrically connect dummy pattern portions 60A to the respective metal pads 40. Each of dummy pattern portions 60A includes two ends. In some embodiments, one, but not both, of the ends of dummy pattern portion 60A is connected to metal pad 40 through dummy pattern portion 60B. In alternative embodiment, both ends of dummy pattern portion 60A are connected to metal pad 40 through dummy pattern portion 60B. In yet alternative embodiments, dummy pattern portions 60B are not formed, and dummy pattern portions 60A are disconnected from metal pads 40, and are electrically floating.

Figure 3B:
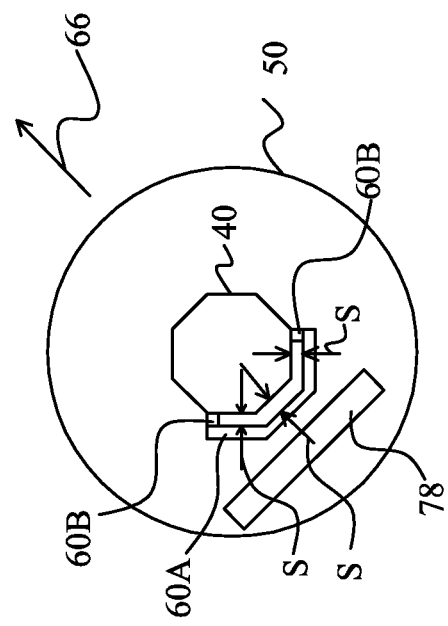
Figure 3C:
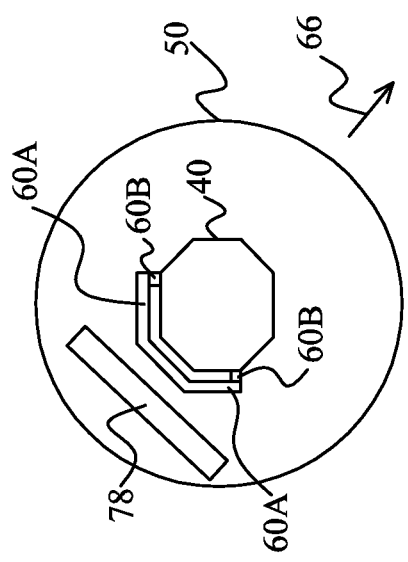
Figure 3D:
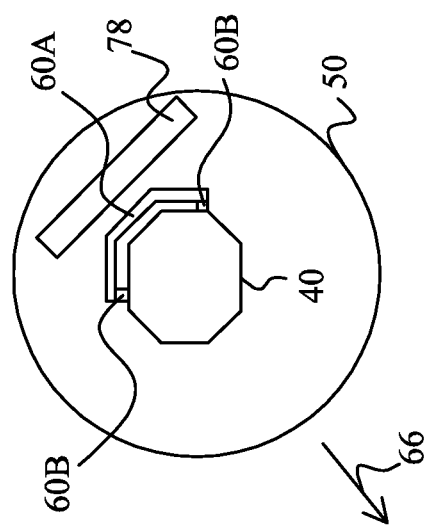

FIG. 3A illustrates a top view of a connector structure in corner region 64A1 (FIG. 1) of die 100, wherein dummy pattern 60 (including portion 60A and optionally portion 60B) is disposed on the right bottom side of metal pad 40. Similarly, FIGS. 3B, 3C, and 3D illustrate connector structures in corner regions 64A2, 64A3, and 64A4 (FIG. 1) of die 100, wherein dummy patterns 60 (including portion 60A and optional portion 60B) are disposed on the left bottom side, left top side, and right top side, of the respective metal pads 40. On the opposite side of metal pad 40, which side is toward center 100C of die 100 (refer to FIG. 1), there is no dummy patterns 60 formed, although dummy patterns 60 may also extend to the opposite side (FIG. 5).

Figure 4C:
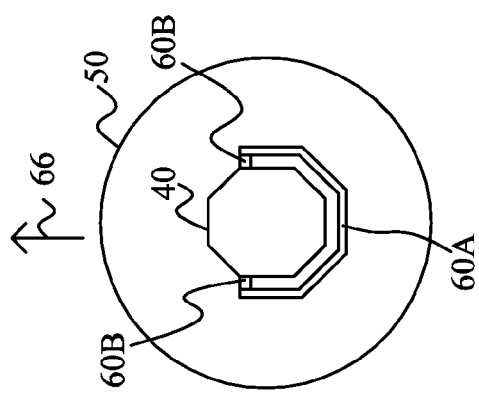
Figure 4D:
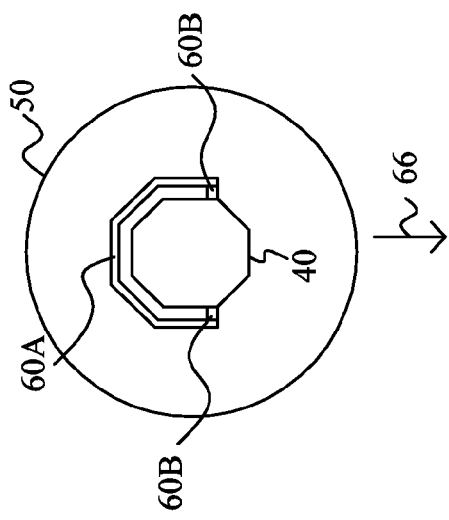

FIG. 4A illustrates a top view of a connector structure in edge region 64B1 (the right edge, FIG. 1) of die 100, wherein dummy pattern 60 (including portion 60A and optionally portion 60B) comprises a portion on the right side of metal pad 40. Similarly, FIGS. 4B, 4C, and 4D illustrate connector structures in edge regions 64B2, 64B3, and 64B4 (FIG. 1) of die 100, wherein dummy patterns 60 (including portion 60A and optional portion 60B) are disposed on the left side, bottom side, and top side, of the respective metal pads 40. On the opposite side of metal pad 40, which side is toward center 100C of die 100, there may not be dummy patterns 60 formed, although dummy patterns 60 may also extend to the opposite side (FIG. 5).

Figure 5:
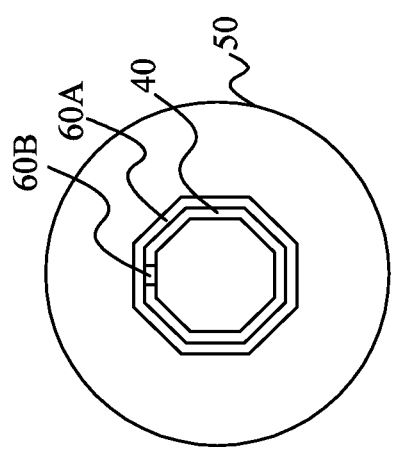

FIG. 5 illustrate a connector structure in accordance with alternative embodiments, wherein dummy pattern 60 forms a full ring fully encircling metal pad 40. Dummy pattern portion 60B may also be formed as an optional feature for connecting dummy pattern portion 60A to metal pad 40. It is appreciated that the embodiments shown in FIGS. 3A through 5 may be mixed on a same die. At each of corner regions 64A or edge regions 64B, dummy pattern(s) 60 may either form a partial ring or a fully ring.

Figure 6:
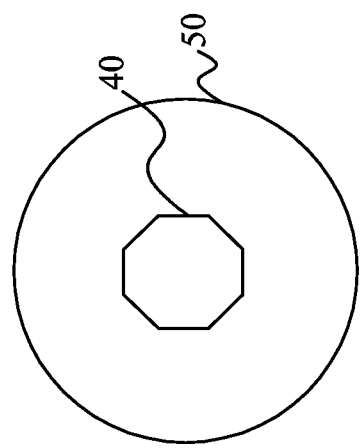

FIG. 6 illustrate a top view of a connector structure in inner region 64C (FIG. 1) of die 100. It is observed that there is no dummy pattern formed adjacent to metal pads 40 that are in inner region 64C. In addition, in each of edge regions 64B and corner regions 64A, there may exist metal pads 40 that do not have adjacent dummy patterns, as shown in FIG. 1.

Figure 7:
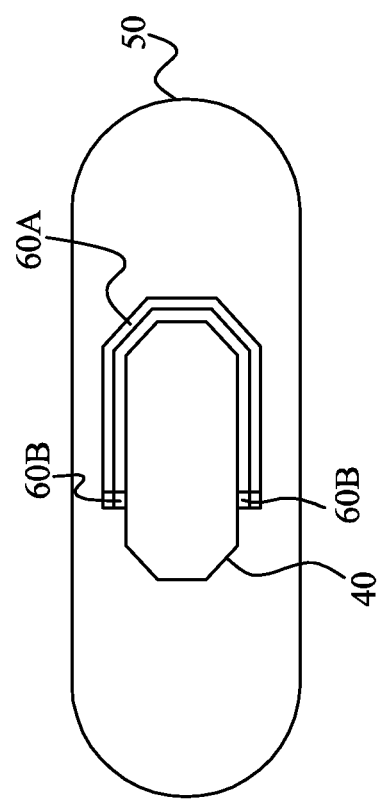
FIG. 7 illustrates a top view of a metal pad, a metal pillar, and a respective dummy pattern, which may be used to form a bump-on-trace structure.

In FIGS. 3A through 4D, metal pads 40 and metal pillars 50 do not have elongated shapes (in the top view). In alternative embodiments, metal pads 40 and metal pillars 50 may have elongated shapes, with a long axis significantly greater (for example, by at least 20 percent) than a short axis. FIG. 7 illustrates an exemplary connector structure. This structure is similar to the structure shown in FIG. 4A, except the top view shapes of metal pad 40, metal pillar 50, and dummy pattern 60 are stretched in one direction. This structure may be used for forming bump-on-trace structures. Although not shown, each of the connector structures shown in FIGS. 3A-3D and 4B-4D may also be stretched similarly in one direction, and possibly in the directions of the respective arrows 66.

In the embodiments, by forming dummy patterns adjacent to metal pads, the respective connector structures are more robust, and the likelihood of having passivation cracking is reduced. Experimental results indicated that the passivation cracking, when happened, are more likely to occur on the sides of the metal pads away from the center of the die. On the sides toward the center of the die, the passivation cracking is unlikely to occur. Therefore, a partial dummy pattern ring may effectively reduce the passivation cracking. In addition, even if the passivation cracking occurs, it may occur on the sides of dummy patterns away from the center of the die, which dummy patterns may be electrically floating. Accordingly, the passivation cracking may not cause electrical interference to signal-carrying metal lines (such as line 78 in FIGS. 3A through 3D) that are adjacent to the passivation cracking.

In accordance with embodiments, a die includes a substrate, a metal pad over the substrate, and a passivation layer that has a portion over the metal pad. A dummy pattern is disposed adjacent to the metal pad. The dummy pattern is level with, and is formed of a same material as, the metal pad. The dummy pattern forms at least a partial ring surrounding at least a third of the metal pad.

In accordance with other embodiments, a die includes corner regions, edge regions, and an inner region encircled by the corner regions and the edge regions. The die further includes a substrate, a first metal pad over the substrate and in one of the corner regions, a passivation layer having a portion over the first metal pad, and a metal pillar overlapping and electrically coupled to the first metal pad. The metal pillar extends over a surface dielectric layer of the die. The die further includes a dummy pattern adjacent to the first metal pad, wherein a portion of the dummy pattern and a center of the die are on opposite sides of the first metal pad. A second metal pad is disposed over the substrate and in the inner region, wherein no dummy pattern is adjacent to the second metal pad. The first dummy pattern is level with, and is formed of a same material as, the first metal pad, the second metal pad, and the first dummy pattern.

In accordance with yet other embodiments, a die includes corner regions, edge regions, and an inner region encircled by the corner regions and the edge regions. The die further includes a substrate, a first metal pad over the substrate and in a first one of the corner regions of the die, a passivation layer having a portion over the first metal pad, and a second metal pad over the substrate and in a second one of the corner regions of the die. A first and a second dummy pattern are electrically floating, wherein the first and the second dummy patterns are level with and formed of a same material as the first and the second metal pads. Each of the first and the second dummy patterns forms at least a partial ring surrounding at least a third of the first and the second metal pads, respectively.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A device comprising:
   a die comprising:
      a substrate;
      a metal pad over the substrate;
      a passivation layer comprising a portion over the metal pad;
      a dummy pattern adjacent to the metal pad, wherein the dummy pattern is level with, and is formed of a same material as, the metal pad, and wherein the dummy pattern forms at least a partial ring surrounding at least a third of the metal pad; and
      an additional dummy pattern portion connecting the dummy pattern to the metal pad, and wherein the metal pad, the dummy pattern, and the additional dummy pattern portion define a region, with the passivation layer disposed in the region.

2. The device of claim 1, wherein the dummy pattern and a center of the die are on opposite sides of the metal pad, and wherein the dummy pattern does not extend to a same side of the metal pad as the center of the die.

3. The device of claim 1, wherein the dummy pattern and a center of the die are on opposite sides of the metal pad, and wherein the dummy pattern further comprises a portion on a same side of the metal pad as the center of the die.

4. The device of claim 1, wherein corner regions of the die comprise dummy patterns adjacent to respective corner metal pads, wherein the dummy patterns are at a same level as the metal pad, and wherein an inner region of the die does not comprise dummy patterns at the same level as the metal pad.

5. The device of claim 1, wherein the dummy pattern is electrically disconnected from any feature in the die other than the additional dummy pattern portion and the metal pad.

6. The device of claim 1, wherein the metal pad has an elongated shape, wherein the elongated shape has a long axis greater than a short axis by at least about twenty percent.

7. The device of claim 3, wherein the dummy pattern forms a full ring encircling the metal pad.

8. The device of claim 4, wherein edge regions of the die further comprise additional dummy patterns adjacent to respective edge metal pads, and wherein the additional dummy patterns are at the same level as the metal pad.

9. A device comprising:
a die comprising corner regions, edge regions, and an inner region encircled by the corner regions and the edge regions, wherein the die further comprises:
a substrate;
a first metal pad over the substrate and in one of the corner regions;
a passivation layer comprising a portion over the first metal pad;
a metal pillar overlapping and electrically coupled to the first metal pad, wherein the metal pillar extends over a surface dielectric layer of the die;
a first dummy pattern adjacent to the first metal pad, wherein a portion of the first dummy pattern and a center of the die are on opposite sides of the first metal pad;
an additional dummy pattern portion connecting the first dummy pattern to the first metal pad, and wherein the first metal pad, the first dummy pattern, and the additional dummy pattern portion define a region, with the passivation layer disposed in the region; and
a second metal pad over the substrate and in the inner region, wherein no dummy pattern is adjacent to the second metal pad, wherein the first dummy pattern is level with, and is formed of a same material as, the first metal pad, the second metal pad, and the first dummy pattern.

10. The device of claim 9, wherein the first dummy pattern forms at least a partial ring surrounding at least a third of the first metal pad.

11. The device of claim 9 further comprising:
a third metal pad over the substrate and in one of the edge regions; and
a second dummy pattern adjacent to the third metal pad, wherein a portion of the second dummy pattern and the center of the die are on opposite sides of the third metal pad.

12. The device of claim 9, wherein the first dummy pattern further comprises an additional portion on a same side of the first metal pad as the center of the die.

13. The device of claim 9 further comprising:
a third metal pad over the substrate, wherein the first and the third metal pads are in different ones of the corner regions; and
a second dummy pattern adjacent to the third metal pad, wherein a portion of the second dummy pattern and the center of the die are on opposite sides of the third metal pad, and wherein each of the first and the second dummy patterns forms at least a partial ring surrounding at least a third of the first and the third metal pads, respectively.

14. The device of claim 9 further comprising an under-bump-metallurgy (UBM) having edges aligned to respective edges of the metal pillar, wherein a top surface and a bottom surface of the UBM is in physical contact with the metal pillar and the metal pad, respectively.

15. A device comprising:
a die comprising corner regions, edge regions, and an inner region encircled by the corner regions and the edge regions, wherein the die further comprises:
a substrate;
a first metal pad over the substrate and in a first one of the corner regions of the die;
a passivation layer comprising a portion over the first metal pad;
a second metal pad over the substrate and in a second one of the corner regions of the die;
a first and a second dummy pattern, the second dummy pattern being electrically floating, wherein the first and the second dummy patterns are level with and formed of a same material as the first and the second metal pads, and wherein each of the first and the second dummy patterns forms at least a partial ring surrounding at least a third of the first and the second metal pads, respectively; and
an additional dummy pattern portions connecting the first dummy patterns to the first metal pad, wherein the first metal pad, the first dummy pattern, and the additional dummy pattern portions define a region, with the passivation layer disposed in the region, and wherein the first dummy pattern is electrically disconnected from any feature in the die other than the additional dummy pattern portion and the first metal pad.

16. The device of claim 15, wherein a portion of the first dummy pattern and a center of the die are on opposite sides of the first metal pad.

17. The device of claim 15 further comprising a third metal pad over the substrate and in the inner region, wherein no dummy pattern at a same level as the first metal pad is adjacent to the third metal pad.

18. The device of claim 15 further comprising a third metal pad in a edge row of the die, with the edge row being closest to an edge of the die, and wherein no dummy pattern is formed to partially surround the third metal pad.

19. The device of claim 15, wherein the first dummy pattern surrounds at least a half of the first metal pad.

20. The device of claim 16, wherein the first and the second dummy patterns are on opposite sides of the center of the die and the first and the second metal pads, and wherein none of the first and the second dummy patterns comprises any portion on a same side of the respective first and second metal pads as the center of the die.

* * * * *